US010594509B2

(12) United States Patent
Pannwitz et al.

(10) Patent No.: US 10,594,509 B2
(45) Date of Patent: Mar. 17, 2020

(54) OSCILLATOR, TRANSMISSION/RECEPTION DEVICE FOR A BUS SYSTEM AND METHOD FOR GENERATING A CLOCK FREQUENCY USING THE OSCILLATOR

(71) Applicant: Robert Bosch GmbH, Stuttgart (DE)

(72) Inventors: Axel Pannwitz, Radebeul (DE); Ingo Hehemann, Hagen A.T.W. (DE)

(73) Assignee: Robert Bosch GmbH, Stuttgart (DE)

( * ) Notice: Subject to any disclaimer, the term of this patent is extended or adjusted under 35 U.S.C. 154(b) by 283 days.

(21) Appl. No.: 15/123,593

(22) PCT Filed: Feb. 26, 2015

(86) PCT No.: PCT/EP2015/054000
§ 371 (c)(1),
(2) Date: Sep. 2, 2016

(87) PCT Pub. No.: WO2015/132121
PCT Pub. Date: Sep. 11, 2015

(65) Prior Publication Data
US 2017/0078113 A1    Mar. 16, 2017

(30) Foreign Application Priority Data
Mar. 5, 2014   (DE) .................. 10 2014 204 047

(51) Int. Cl.
*G06F 1/00*         (2006.01)
*H04L 12/40*        (2006.01)
*H03K 3/0231*       (2006.01)

(52) U.S. Cl.
CPC ..... *H04L 12/40032* (2013.01); *H03K 3/0231* (2013.01); *H04L 12/40019* (2013.01); *H04L 2012/40215* (2013.01)

(58) Field of Classification Search
CPC ......... H04L 12/40032; H04L 12/40019; H04L 2012/40215; H03K 3/0231
See application file for complete search history.

(56) References Cited

U.S. PATENT DOCUMENTS 6,018,233 A * 1/2000 Glennon ................. F02N 11/04
                                                  322/22
7,474,163 B1   1/2009 Wile et al.
(Continued)

FOREIGN PATENT DOCUMENTS

| CN | 101158877 A | 4/2008 |
| CN | 102045041 A | 5/2011 |

(Continued)

OTHER PUBLICATIONS

International Search Report dated Jun. 15, 2015, of the corresponding International Application PCT/EP2015/054000 filed Feb. 26, 2015.

*Primary Examiner* — Xuxing Chen
(74) *Attorney, Agent, or Firm* — Norton Rose Fulbright US LLP; Gerard Messina (57) ABSTRACT

An oscillator, a transmission/reception device for a bus system, and a method for generating a clock frequency with the oscillator are indicated. The oscillator serves to generate a clock frequency and includes a timing element that has a frequency-determining capacitance for determining the frequency of the clock frequency, and a comparator, the comparator being configured to detect a threshold voltage to which the frequency-determining capacitance is to be charged, and the comparator having a switchable capacitance for offset compensation.

9 Claims, 6 Drawing Sheets (56) References Cited

U.S. PATENT DOCUMENTS

| | | | |
|---|---|---|---|
| 2010/0164638 A1 | 7/2010 | Saw | |
| 2011/0085065 A1* | 4/2011 | Egawa | H04N 5/357 348/294 |
| 2012/0319789 A1* | 12/2012 | Bhowmik | H03K 3/0231 331/143 |

FOREIGN PATENT DOCUMENTS

| | | |
|---|---|---|
| DE | 19611942 A1 | 10/1997 |
| EP | 1280024 A1 | 1/2003 |
| WO | 2011059322 A1 | 5/2011 |
| WO | 2010129927 A1 | 10/2012 |

* cited by examiner

OSCILLATOR, TRANSMISSION/RECEPTION DEVICE FOR A BUS SYSTEM AND METHOD FOR GENERATING A CLOCK FREQUENCY USING THE OSCILLATOR

FIELD

The present invention relates to an oscillator, to a transmission/reception device for a bus system, and to a method for generating a clock frequency using the oscillator, which can be utilized, for example in the context of a subscriber station for a CAN bus system, as a time base for a CAN transceiver for partial networking.

BACKGROUND INFORMATION

The CAN bus system is in widespread use for communication between two or more bus subscribers, for example sensor(s), control device(s), etc. In the CAN bus system, messages are transferred by way of the CAN protocol as described in the CAN specification in ISO 11898.

A transmission/reception device, which with reference to CAN is also called a "CAN transceiver," is generally used to receive and transmit the messages in the bus system. In the context of CAN, transmission/reception devices of this kind are recently being configured, in some application instances, as CAN transceivers for partial networking, also called "partial networking transceivers." For this, the CAN transceiver must be equipped with a highly accurate time base. The requirement here is that the frequency and time tolerance in the temperature range from −40° C. to 175° C. have a value, depending on jitter, of between +/−1% and +/−1.6%. A further complicating requirement for the time base is that a current consumption of only <150 µA is desired for the entire CAN transceiver in reception mode.

One solution to this problem would be to use a quartz oscillator or a ceramic resonator as a time base. This solution is ruled out for a CAN transceiver, however, for reasons of cost or space.

SUMMARY

An object of the present invention is therefore to furnish an oscillator, a transmission/reception device for a bus system, and a method for generating a clock frequency with the oscillator, which solve the aforementioned problems. The intention in particular is to furnish an oscillator, a transmission/reception device for a bus system, and a method for generating a clock frequency with the oscillator, in which a low current consumption, namely <150 µA, is achieved inexpensively in the reception mode of a CAN transmission/reception device (a CAN transceiver), and a highly accurate time base is furnished in space-saving fashion.

The object may be achieved by an oscillator for generating a clock frequency in accordance with an example embodiment of the present invention. The oscillator encompasses a timing element that has a frequency-determining capacitance for determining the frequency of the clock frequency, and a comparator, the comparator being configured to detect a threshold voltage to which the frequency-determining capacitance is to be charged, and the comparator having a switchable capacitance for offset compensation.

With the oscillator, an inexpensive and highly accurate time base having a very low current consumption can be furnished. In particular, the values required by some users, of up to +/−1.0% frequency and time tolerance in the temperature range from −40° C. to 175° C., and a current consumption of <150 µA in the reception mode, are complied with.

It is furthermore advantageous if the dimensions of the oscillator are so small that it can be used without difficulty as a transmission/reception device of a bus system, in particular for a CAN transceiver for partial networking.

The oscillator is also suitable for use in higher-clocked systems, for example CAN-HS, CAN-FD, etc. In a high-speed CAN bus system (CAN-HS), a data transfer rate of up to 500 kbit per second (500 kbps) is possible. In a CAN-FD system, a data transfer rate of more than 1 Mbit per second (1 Mbps) is possible.

Advantageous further embodiments of the oscillator are described herein.

The switchable capacitance is possibly connectable in series with the frequency-determining capacitance, and/or the comparator has a MOS transistor for detection of the threshold voltage.

The oscillator can also have a switch for switching a voltage source in order to supply the comparator with a final voltage, the voltage source being connected in parallel with the frequency-determining capacitance when the switch is closed in an offset phase, and the switchable capacitance being chargeable to the voltage difference between the final voltage and threshold voltage when the switch is closed in the offset phase.

Preferably, the oscillator furthermore encompasses a switch for connecting the frequency-determining capacitance of the timing element in series with the switchable capacitance, the switch being opened in an offset phase and being closed in a charging phase of the frequency-determining capacitance.

The oscillator can furthermore have a switch for short-circuiting the frequency-determining capacitance, the switch being closed in an offset phase and being opened in a charging phase of the frequency-determining capacitance.

The oscillator can also have a switch for short-circuiting the drain and gate of a MOS transistor of the comparator, which MOS transistor serves to detect the threshold voltage, the switch being closed in an offset phase and being opened in a charging phase of the frequency-determining capacitance.

The oscillator preferably has a second timing element that is constructed like the first timing element, and a logic element that is connected between the first and the second timing element in order to apply control to the switchable capacitance.

The object described above may be furthermore achieved by a transmission/reception device for a subscriber station for a bus system, in accordance with an example embodiment of the present invention. The transmission/reception device is embodied to transmit or receive a message from at least one further subscriber station of the bus system via the bus system, in which bus system exclusive, collision-free access by a subscriber station to a bus of the bus system is ensured at least at times, the transmission/reception device having an oscillator having a first and a second timing element and a logic element, the first and the second timing element being identically constructed and the logic element being connected between the first and the second timing element, and the oscillator being capable of being configured as described above.

The subscriber station described above can be part of a bus system that has a bus and at least two subscriber stations that are connected to one another via the bus in such a way that they can communicate with one another. At least one of the at least two subscriber stations has an above-described transmission/reception device.

The object described above may be furthermore achieved by a method for generating a clock frequency with an oscillator, in accordance with an example embodiment of the present invention.

In the method, the oscillator encompasses a timing element having a frequency-determining capacitance and a comparator. The method encompasses the steps of: compensating for an offset with a switchable capacitance of the comparator; detecting, with the comparator, a threshold voltage to which the frequency-determining capacitance is to be charged; and determining, with the frequency-determining capacitance, the frequency of the clock frequency.

The method offers the same advantages as recited previously with reference to the oscillator.

Further possible implementations of the present invention also encompass combinations, not explicitly recited, of features or embodiments described previously or hereinafter with regard to the exemplifying embodiments. One skilled in the art will also add individual aspects to the respective basic form of the present invention as improvements or supplements.

BRIEF DESCRIPTION OF THE DRAWINGS

The present invention is described in further detail below with reference to the figures and on the basis of exemplifying embodiments described herein.

In the Figures, identical or functionally identical elements are labeled with the same reference characters unless otherwise indicated.

DETAILED DESCRIPTION OF EXAMPLE EMBODIMENTS

Figure 1:
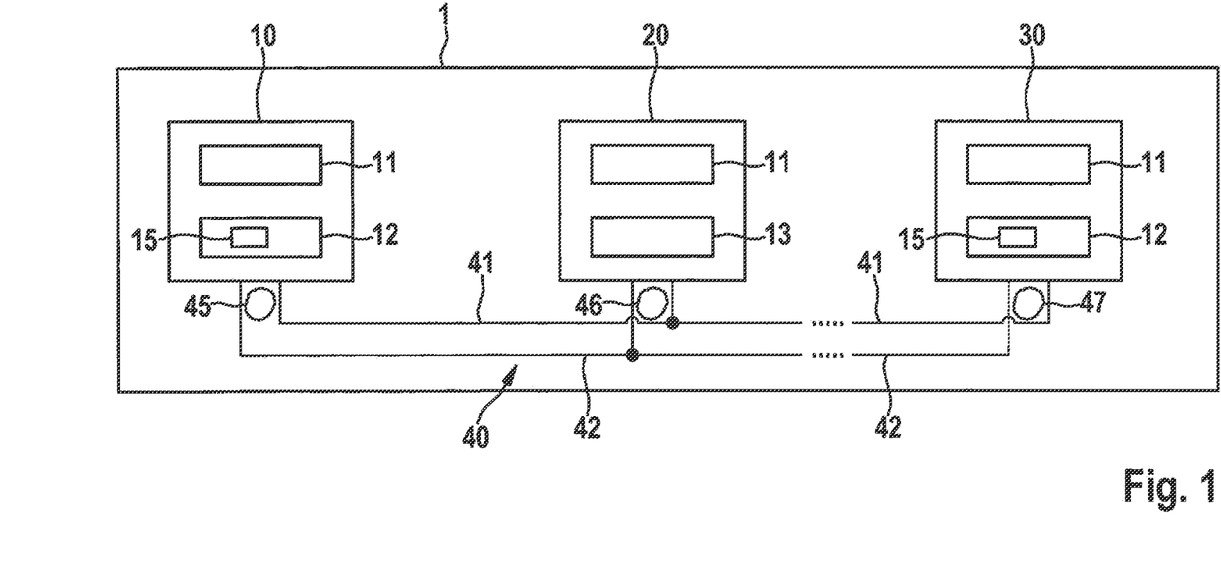
FIG. 1 is a simplified block diagram of a bus system according to a first exemplifying embodiment.

FIG. 1 shows a bus system 1 that can be, for example, a CAN bus system, a CAN-FD bus system, etc. Bus system 1 can be utilized in a vehicle, in particular a motor vehicle, an aircraft, etc., or in a hospital, etc.

In FIG. 1, bus system 1 has a plurality of subscriber stations 10, 20, 30 that are each connected to a bus 40 having a first bus wire 41 and a second bus wire 42. Bus wires 41, 42 can also be called CAN_H and CAN_L, and serve to couple in the dominant level in the transmitting state. Messages 45, 46, 47 in the form of signals can be transferred via bus 40 between the individual subscriber stations 10, 20, 30. Subscriber stations 10, 20, 30 can be, for example, control devices or indicating apparatuses of a motor vehicle.

As shown in FIG. 1, subscriber stations 10, 30 each have a communication control device 11 and a transmission/reception device 12. Transmission/reception devices 12 each encompass an oscillator 15. Subscriber station 20, on the other hand, has a communication control device 11 and a transmission/reception device 13. Transmission/reception devices 12 of subscriber stations 10, 30 and transmission/reception device 13 of subscriber station 20 are each directly connected to bus 40, even though this is not depicted in FIG. 1

Communication control device 11 serves to control a communication of the respective subscriber station 10, 20, 30 via bus 40 with another subscriber station of subscriber stations 10, 20, 30 connected to bus 40. Transmission/reception device 12 serves to transmit messages 45, 47 in the form of signals, and uses oscillator 15 in this context as a time base, as will be explained in further detail later. Communication control device 11 can be embodied like a conventional CAN controller. Transmission/reception device 13 can be embodied like a conventional CAN transceiver.

Figure 2:
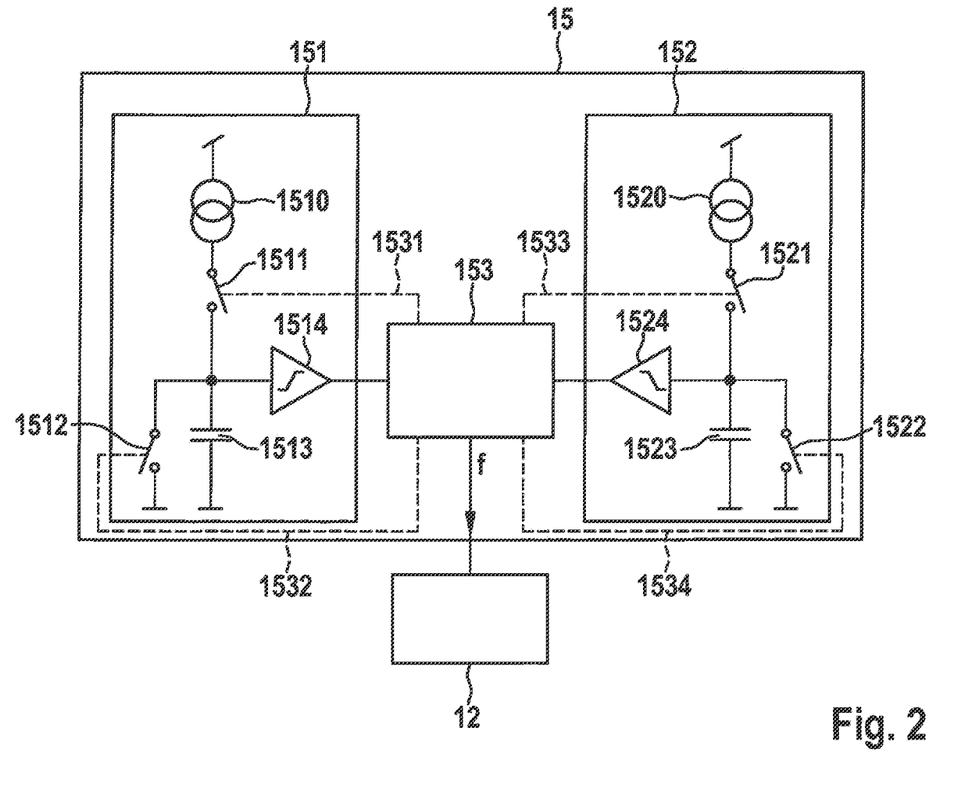
FIG. 2 is an electrical circuit diagram of an oscillator for a transmission/reception device of the bus system, according to the first exemplifying embodiment.

FIG. 2 shows the basic construction of oscillator 15, which encompasses a first timing element 151, a second timing element 152, and a logic element 153. First timing element 151 has a current source 1510, a first switch 1511, a second switch 1512, a capacitance 1513, and a comparator 1514. Second timing element 152 has a current source 1520, a first switch 1521, a second switch 1522, a capacitance 1523, and a comparator 1524. First and second timing element 151, 152 are preferably of identical construction.

In FIG. 2, logic element 153 is configured with regard to first timing element 151 so as to switch first switch 1511 via a connection 1531. Logic element 153 can furthermore switch second switch 1512 via a connection 1532.

With regard to second timing element 152, logic element 153 is configured to switch first switch 1521 via a connection 1533. Logic element 153 can furthermore switch second switch 1522 via a connection 1534. As illustrated in FIG. 2, logic element 153 outputs a resulting frequency f to transmission/reception device 12 as a time base. Frequency f can also be referred to as an "oscillation frequency" or "clock frequency" of oscillator 15.

In oscillator 15, the oscillation frequency or clock frequency is determined by the time taken by capacitances 1513, 1523 to charge to a specific voltage threshold. Comparator 1514 serves to detect the voltage threshold. This is also explained further with reference to FIG. 3.

Figure 3:
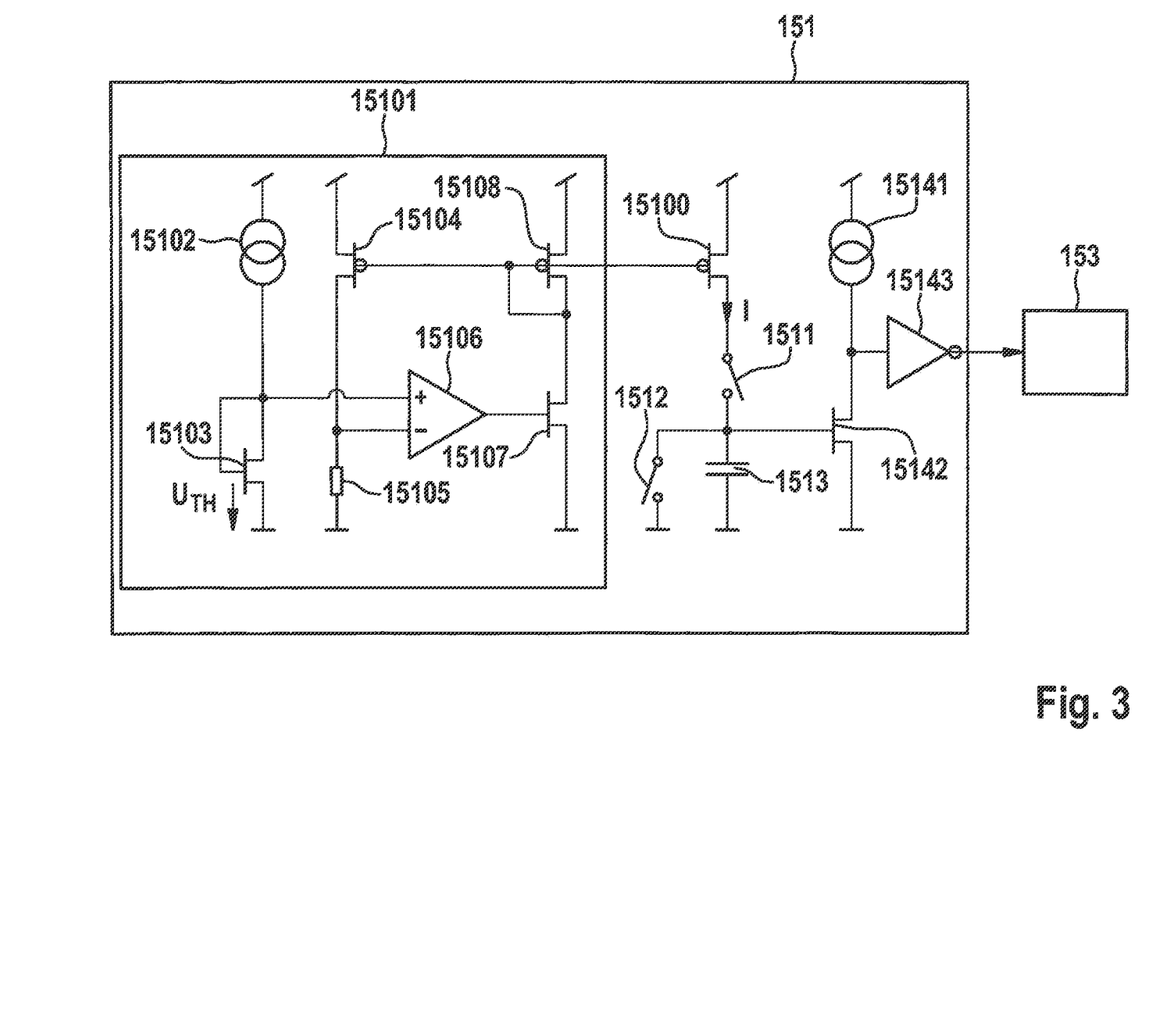
FIG. 3 is an electrical circuit diagram of a timing element of the oscillator of FIG. 2.

FIG. 3 shows first timing element 151 in further detail with regard to current source 1510 and comparator 1514 of FIG. 2. In FIG. 3, current source 1510 of FIG. 2 is a MOS transistor 15100, which can also be referred to as a metal oxide semiconductor field-effect transistor (MOSFET). A gate voltage of MOS transistor 15100 is determined by a regulating circuit 15101. Comparator 1514 of FIG. 2 encompasses, according to FIG. 3, a current source 15141 and a MOS transistor 15142. Control is applied to logic element 153 by a driver 15143.

Regulating circuit 15101 encompasses a constant current source 15102, a MOS transistor 15103 that is identical to MOS transistor 15142, a MOS transistor 15104, a resistor 15105, an amplifier 15106, a MOS transistor 15107, and a MOS transistor 15108. The gate of MOS transistor 15108 is connected both to the gate of MOS transistor 15100 and to the gate of MOS transistor 15104. MOS transistors 15100, 15104, 15108 constitute a current mirror. Resistor 15105 is connected at its one end to the drain terminal of MOS transistor 15104 and to the inverting terminal of amplifier 15106. At its other end, resistor 15105 is grounded.

The drain terminal and the gate of MOS transistor 15103, and current source 15102, are connected to the non-inverting terminal of amplifier 15106.

In the circuit in FIG. 3, the current I through first switch 1511 is determined as $$I \approx (U_{TH}/R) \quad (1)$$

where $U_{TH}$ is the threshold voltage of MOS transistor 15103 and the switching threshold of MOS transistor 15142, and R is the resistance of resistor 15105.

MOS transistors 15100, 15104, 15108 can also be any other semiconductor switches or transistors, for example bipolar transistors, etc.

In the circuit of FIG. 2 and FIG. 3, in the context of first and second timing element 151, 152 the frequency-determining capacitance 1513 or 1523 is alternately charged to the final voltage, by the actuation of switches 1511, 1512, 1521, 1522, with the aid of a current from the respective current source 1510, 1520. When timing element 151 is inactive, capacitance 1513 is completely discharged. When timing element 152 is inactive, capacitance 1523 is completely discharged. This results in the predetermined frequency f that can serve as a time base for transmission/reception device 12.

Oscillator 15 according to the present exemplifying embodiment thus has a single MOS transistor as comparator 1514. In oscillator 15, capacitance 1513 is charged from 0 V to the threshold voltage $U_{TH}$ of MOS transistor 15103. The threshold voltage $U_{TH}$ can have a value from 0.4 to 0.8 V. The advantages of this principle are low current consumption simultaneously with a low switching delay. Regulating circuit 15101 generates the charging current of capacitance 1513 as a function of the respective threshold voltage $U_{TH}$.

Oscillator 15 can thereby supply the accurate, current-saving, inexpensive, and space-saving time base required for transmission/reception device 12.

Figure 4:
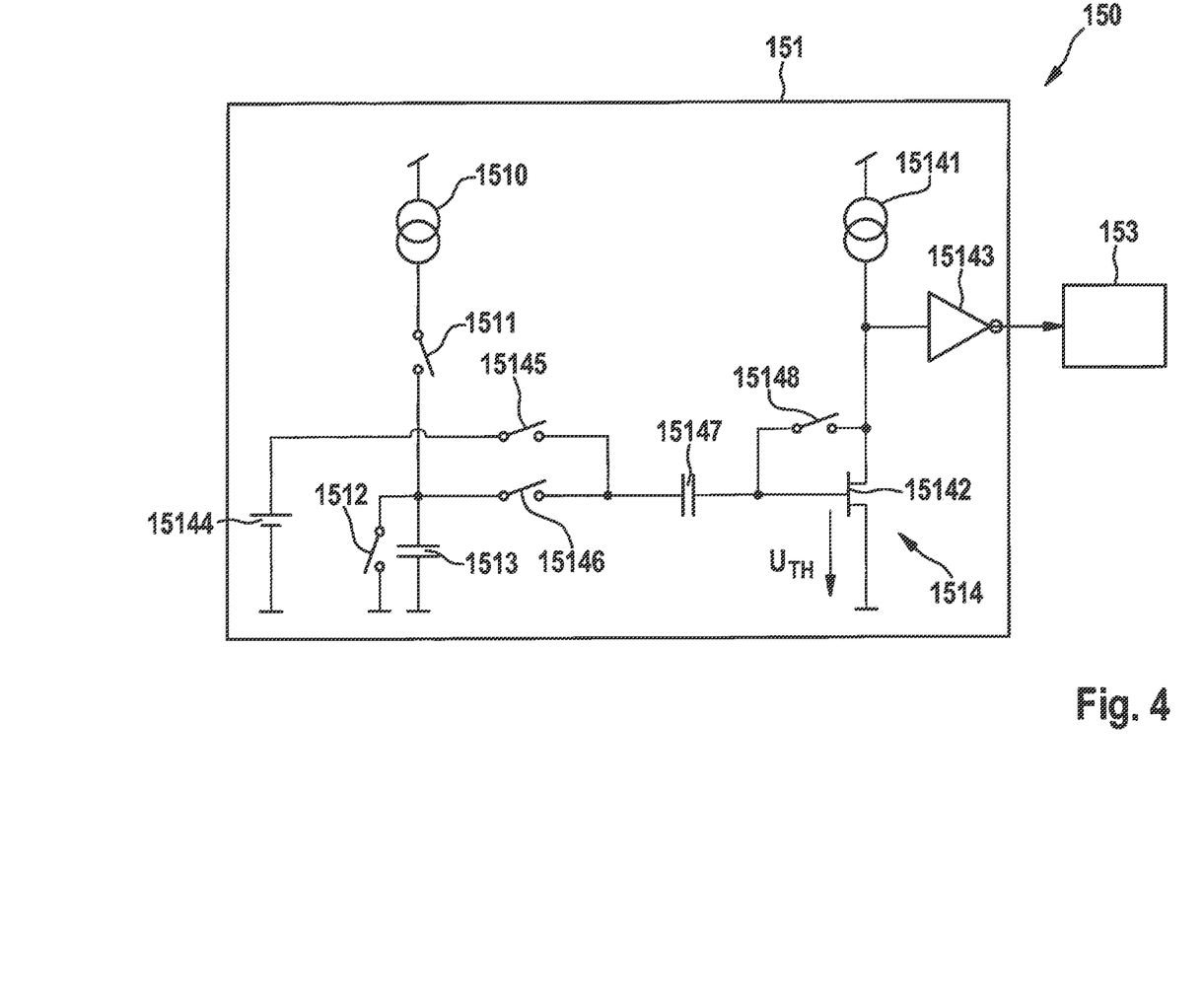
FIG. 4 is an electrical circuit diagram of part of an oscillator for a transmission/reception device of the bus system, according to a second exemplifying embodiment.

FIG. 4 shows first timing element 151 and logic element 153 of an oscillator 150 according to a second exemplifying embodiment. The second timing element of oscillator 150 is not depicted in FIG. 4, but is constructed in the same manner as first timing element 151 and is likewise connected to logic element 153.

In oscillator 150 according to the present exemplifying embodiment, comparator 1514 has a voltage source 15144 that defines a final voltage $U_{final}$ of the charging operation, a first switch 15145, a secondswitch 15146, a capacitance 15147, and a third switch 15148. Current source 1510 in FIG. 4 is embodied in such a way that the charging current is fixed on the basis of the fixed final voltage $U_{final}$, or is proportional to the final voltage $U_{final}$.

Elements 15144 to 15146 of FIG. 4 serve for offset compensation. In the interest of clarity, the connections between logic element 153 and switches 1511, 1512, 15145, 15146, 15148 are not depicted in FIG. 4.

Figure 5:
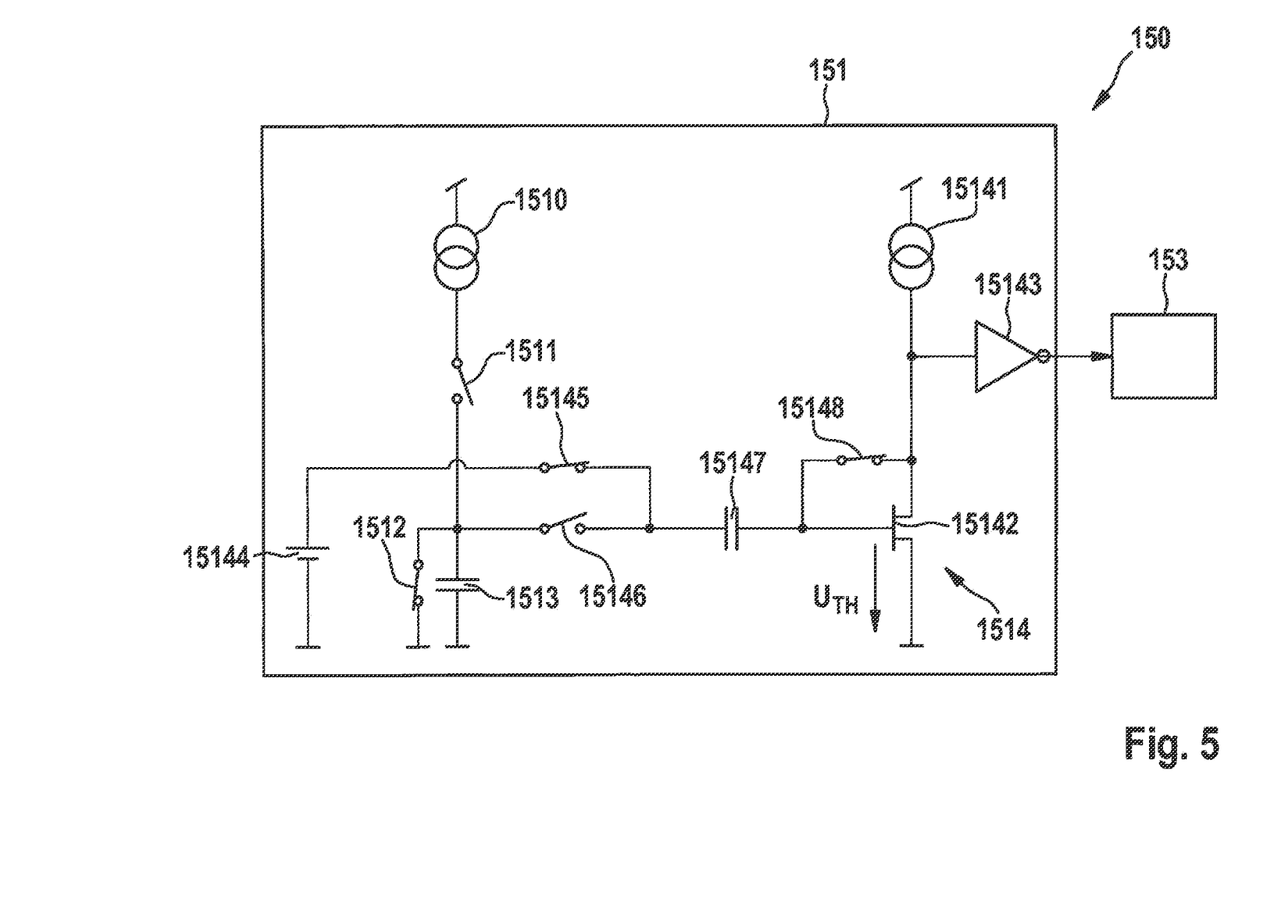
FIG. 5 shows the electrical circuit diagram of FIG. 4 with a switch position in the offset phase.
Figure 6:
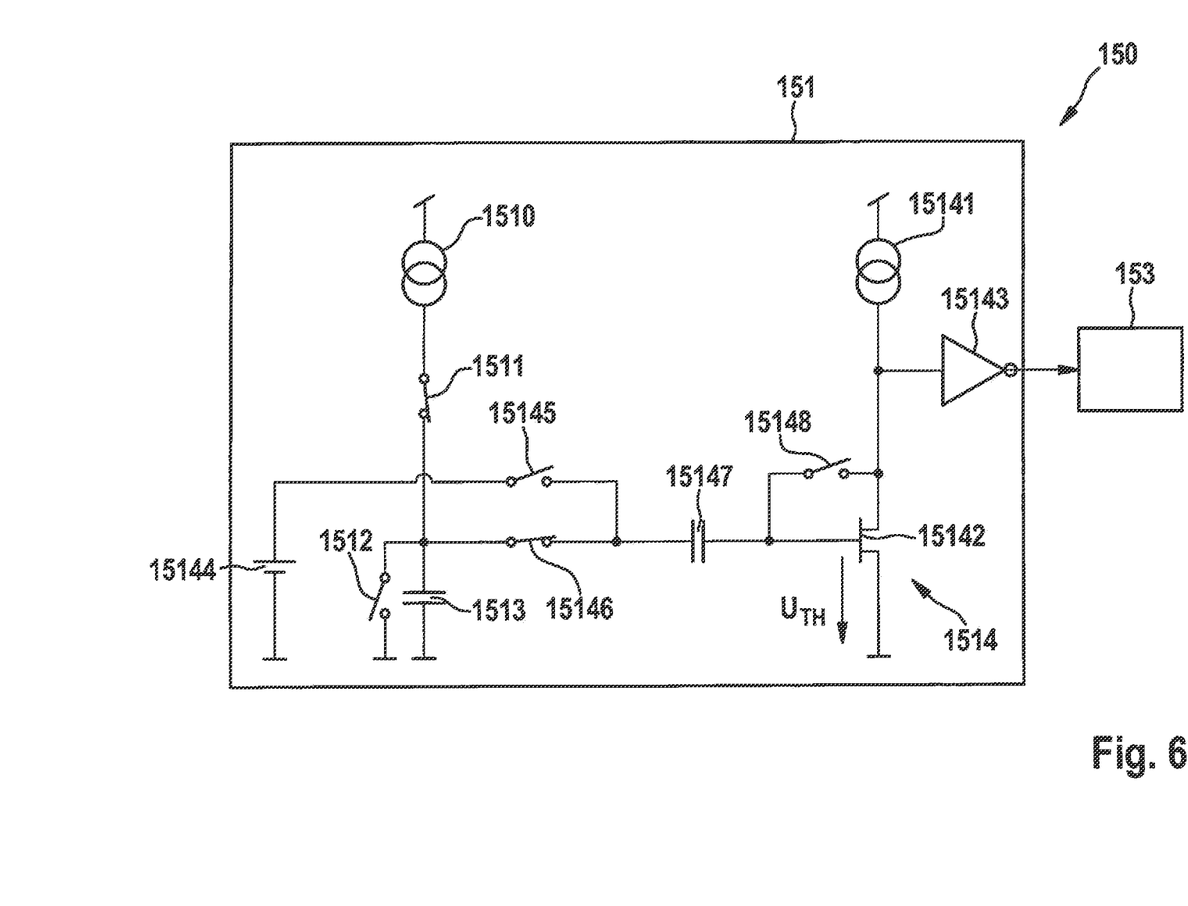
FIG. 6 shows the electrical circuit diagram of FIG. 5 with a switch position in the charging phase of a capacitance.

As shown in FIG. 5, switches 1512, 15145, 15148 are closed in an offset phase. As shown in FIG. 6, switches 1511, 15146 are closed during a charging phase of the frequency-determining capacitance 1513. The final voltage $U_{final}$ at voltage source 15144 is a freely selectable voltage to which the frequency-determining capacitance 1513 is charged. Comparator 1514 is thus a comparator having a switched capacitance, or an SC (switched capacitor) comparator.

In the circuit of FIGS. 4 and 5 and of FIG. 6 as well, in the context of first timing element 151 the frequency-determining capacitance 1513 is alternately charged to the final voltage $U_{final}$ by the actuation of switches 1511, 1512 with logic element 153, with the aid of a current from current source 1510.

Capacitance 1513 is completely discharged when first timing element 151 is inactive. The second timing element functions in the same manner, as already described with reference to the first exemplifying embodiment.

With the circuit of FIG. 5, in the offset phase the drain and gate of MOS transistor 15142 are short-circuited by closing third switch 15148. The threshold voltage $U_{TH}$ is thus constituted at the gate of MOS transistor 15142. At the same time, capacitance 15147, which can also be referred to as a "series capacitance," becomes connected between the gate of MOS transistor 15142 and voltage source 15144. This voltage source 15144 determines the end of the subsequent charging ramp for the frequency-determining capacitance 1513. Capacitance 15147 becomes charged to the voltage difference $U_{diff}$ between the final voltage $U_{final}$ and threshold voltage $U_{TH}$, such that:

$$U_{diff} = U_{final} - U_{TH} \quad (2).$$

The offset phase is followed by the charging phase, which ultimately determines the frequency f of oscillator 150 and is illustrated by FIG. 6. Here capacitance 15147 is switched by the final voltage source to the completely discharged frequency-determining capacitance 1513. The short circuit between the drain and gate of MOS transistor 15142 is of course previously nullified. The result is that at this initial moment, the negative voltage from capacitance 15147 is now present at the gate of MOS transistor 15142. The frequency-determining capacitance 1513 is then charged until the final voltage $U_{final}$ is reached. The gate voltage of MOS transistor 15142 always tracks the voltage at the frequency-determining capacitance 1513 with the voltage difference that is stored in capacitance 15147. When the final voltage $U_{final}$ is reached, the threshold voltage $U_{TH}$ is thus simultaneously reached, and comparator 1514 stops the process.

The second timing element operates in the same manner as first timing element 151.

With oscillator 150 as well, the oscillation frequency or clock frequency is therefore determined by the time taken by capacitance 1513 of first timing element 151, or capacitance 1523 of second timing element 152, to charge to a specific voltage threshold, which in the present exemplifying embodiment is the threshold voltage $U_{TH}$.

With the circuit of FIGS. 4 and 5 and of FIG. 6, there is compensation for the fact that the threshold voltage $U_{TH}$ of MOS transistor 15142 is low and subject to process tolerances, and fluctuates greatly within the temperature range. The temperature-dependent delay time of comparator 1514, which detects the voltage threshold, can thereby be excluded as one of the principal error sources in the generation of an accurate clock frequency f. It is furthermore no longer necessary in the context of oscillator 150 to laboriously generate the charging current of capacitance 1513 using a regulating circuit 15101 according to FIG. 3, which generates the charging current of capacitance 1513 as a function of the respective threshold voltage $U_{TH}$. Because regulating circuit 15101 of FIG. 3 is no longer required in oscillator 150 according to the present exemplifying embodiment, regulating circuit 15101 according to FIG. 3 is thus eliminated as a further error source.

The circuit of FIGS. 4 and 5 and of FIG. 6 also prevents the switching delay of oscillator 150 from being long because of the slow voltage rise speed at capacitance 1513. With the circuit of FIGS. 4 and 5 and of FIG. 6 the voltage swing at capacitance 1513 is greater, so that the threshold voltage $U_{TH}$ of MOS transistor 15142 is more quickly exceeded and the input of driver 15143 is more quickly pulled down.

In summary, with comparator 1514 the delay time and temperature dependence are low. Oscillator 150 for transmission/reception device 12 according to the present exemplifying embodiment has a particularly low current consumption that is below the required 150 µA. In addition, the frequency tolerance and time tolerance in the temperature range from −40° C. to 175° C. is below a value of +/−1.6%. Oscillator 150 can moreover be implemented in very inexpensive and space-saving fashion, since only a very small area on the silicon is occupied.

Oscillator 150 thus has a low current consumption similar to that of, for example, a quartz oscillator, etc. Oscillator 150 furthermore has very good frequency consistency in the desired temperature range from −40° C. to 175° C. Further advantages of oscillator 150 as compared with a quartz oscillator or ceramic resonators are low mechanical sensitivity, fast initial oscillation, and the low cost of oscillator 150. Quartz oscillators or ceramic resonators furthermore require one to two terminals (pins) on an integrated circuit (IC). With quartz oscillators or ceramic resonators, the space for the solder pad connections (bonding pads) is already larger than the solution proposed, i.e., oscillator 150.

The bus system according to the present exemplifying embodiment is otherwise constructed in the same manner as bus system 1 according to the first exemplifying embodiment.

All the above-described embodiments of oscillator 15, 150, of transmission/reception device 12, of subscriber stations 10, 20, 30, of bus system 1, and of the method according to the first and the second exemplifying embodiment can be utilized individually or in all possible combinations. The following modifications in particular are additionally possible.

The above-described bus system 1 according to the first and the second exemplifying embodiment is described with reference to a bus system based on the CAN protocol. Bus system 1 according to the first and/or the second exemplifying embodiment can, however, also be a different type of communication network. It is advantageous, but not an obligatory prerequisite, that exclusive, collision-free access by a subscriber station 10, 20, 30 to bus line 40, or to a shared channel of bus line 40, be guaranteed in the context of bus system 1 at least for certain time spans.

Bus system 1 according to the first and/or the second exemplifying embodiment is, in particular, a CAN network or a CAN-HS network or a CAN FD network or a FlexRay network.

The number and disposition of subscriber stations 10, 20, 30 in bus system 1 according to the first and the second exemplifying embodiment is arbitrary. In particular, only subscriber stations 10 or subscriber stations 30 can also be present in bus systems 1 of the first or the second exemplifying embodiment.

The functionality of the exemplifying embodiments described above can be implemented in a transceiver or a transmission/reception device 12 or transceiver, or in a CAN transceiver or a transceiver chipset or a CAN transceiver chipset, or also in a communication control device 11, etc. Additionally or alternatively, it can be integrated into existing products. It is possible in particular for the functionality in question either to be implemented in the transceiver as a separate electronic module (chip), or to be embedded in an integral total solution in which only one electronic module (chip) is present.

What is claimed is:

1. An oscillator for generating a clock frequency, comprising:
   a timing element that has:
      a frequency-determining capacitance for determining the frequency of the clock frequency,
      a current source,
      a charging switch disposed between the current source and the frequency-determining capacitance,
      a comparator;
   wherein the comparator is configured to detect a threshold voltage to which the frequency-determining capacitance is to be charged;
   wherein the frequency-determining capacitance is charged to the threshold voltage when the charging switch is closed; and
   wherein the comparator has a switchable capacitance for offset compensation;
   a switch for short-circuiting the drain and gate of a MOS transistor of the comparator, which MOS transistor serves to detect the threshold voltage, the switch being closed in an offset phase and being opened in a charging phase of the frequency-determining capacitance.

2. The oscillator as recited in claim 1, wherein at least one of: i) the switchable capacitance is connectable in series with the frequency-determining capacitance, and ii) the comparator has a MOS transistor for detection of the threshold voltage.

3. The oscillator as recited in claim 1, further comprising:
   a switch for switching a voltage source to supply the comparator with a final voltage, the voltage source being connected in parallel with the frequency-determining capacitance when the switch for switching the voltage source is closed in an offset phase;
   wherein the switchable capacitance is chargeable to the voltage difference between the final voltage and threshold voltage when the switch is closed in the offset phase.

4. The oscillator as recited in claim 1, further comprising:
   a switch for connecting the frequency-determining capacitance of the timing element in series with the switchable capacitance, the switch for connecting the frequency-determining capacitance being opened in an offset phase and being closed in a charging phase of the frequency-determining capacitance.

5. The oscillator as recited in claim 1, further comprising:
   a switch for short-circuiting the frequency-determining capacitance, the switch being closed in an offset phase and being opened in a charging phase of the frequency-determining capacitance.

6. The oscillator as recited in claim 1, further comprising:
   a second timing element that is constructed like the first timing element; and
   a logic element that is connected between the first and the second timing element to apply control to the switchable capacitance.

7. A transmission/reception device for a subscriber station for a bus system, the transmission/reception device being embodied to transmit or receive a message from at least one further subscriber station of the bus system via the bus system, in which bus system exclusive, collision-free access by a subscriber station to a bus of the bus system is ensured at least at times, the transmission/reception device having an oscillator having a first and a second timing element and a logic element, the first and the second timing element being identically constructed and the logic element being connected between the first and the second timing element, wherein each of the first and second timing elements includes:

a frequency-determining capacitance for determining the frequency of the clock frequency, a current source, a charging switch disposed between the current source and the frequency-determining capacitance, and a comparator;

wherein the comparator is configured to detect a threshold voltage to which the frequency-determining capacitance is to be charged;

wherein the frequency-determining capacitance is charged to the threshold voltage when the charging switch is closed; and wherein the comparator has a switchable capacitance for offset compensation;

a switch for short-circuiting the drain and gate of a MOS transistor of the comparator, which MOS transistor serves to detect the threshold voltage, the switch being closed in an offset phase and being opened in a charging phase of the frequency-determining capacitance.

8. A bus system, comprising:

a bus; and at least two subscriber stations that are connected to one another via the bus in such a way that they can communicate with one another;

at least one of the at least two subscriber stations having a transmission/reception device, the transmission/reception device being embodied to transmit or receive a message from at least one further subscriber station of the bus system via the bus system, in which bus system exclusive, collision-free access by a subscriber station to a bus of the bus system is ensured at least at times, the transmission/reception device having an oscillator having a first and a second timing element and a logic element, the first and the second timing element being identically constructed and the logic element being connected between the first and the second timing element, wherein each of the first and second timing elements includes:

a frequency-determining capacitance for determining the frequency of the clock frequency, a current source, a charging switch disposed between the current source and the frequency-determining capacitance, and a comparator;

wherein the comparator is configured to detect a threshold voltage to which the frequency-determining capacitance is to be charged;

wherein the frequency-determining capacitance is charged to the threshold voltage when the charging switch is closed; and wherein the comparator has a switchable capacitance for offset compensation;

a switch for short-circuiting the drain and gate of a MOS transistor of the comparator, which MOS transistor serves to detect the threshold voltage, the switch being closed in an offset phase and being opened in a charging phase of the frequency-determining capacitance.

9. A method for generating a clock frequency with an oscillator, the oscillator including a timing element that has a frequency-determining capacitance and a comparator, the method comprising:

compensating for an offset with a switchable capacitance of the comparator;

detecting, with the comparator, a threshold voltage to which the frequency-determining capacitance is to be charged;

charging the frequency-determining capacitance by closing a charging switch disposed between the frequency-determining capacitance and a current source;

determining, with the frequency-determining capacitance, the frequency of the clock frequency;

short-circuiting the drain and gate of a MOS transistor of the comparator, which MOS transistor serves to detect the threshold voltage, the switch being closed in an offset phase and being opened in a charging phase of the frequency-determining capacitance.

\* \* \* \* \*